(12) United States Patent
Howard et al.

(10) Patent No.: US 9,240,619 B2
(45) Date of Patent: Jan. 19, 2016

(54) DIFFERENTIAL TRANSMISSION LINE PAIRS USING A COUPLING ORTHOGONALIZATION APPROACH TO REDUCE CROSS-TALK

(75) Inventors: Gregory E. Howard, Plano, TX (US); Amneh Akour, Richardson, TX (US); Yanli Fan, Allen, TX (US); Karlheinz Muth, Richardson, TX (US); Mark W. Morgan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 836 days.

(21) Appl. No.: 13/096,808

(22) Filed: Apr. 28, 2011

(65) Prior Publication Data
US 2012/0275122 A1 Nov. 1, 2012

(51) Int. Cl.
H05K 1/02 (2006.01)
H01P 1/18 (2006.01)
H01P 3/02 (2006.01)
H01L 23/66 (2006.01)

(52) U.S. Cl.
CPC ............... *H01P 1/184* (2013.01); *H01P 3/026* (2013.01); *H05K 1/0245* (2013.01); *H01L 23/66* (2013.01); *H01L 2223/6638* (2013.01); *H01L 2924/0002* (2013.01); *H05K 2201/09245* (2013.01)

(58) Field of Classification Search
CPC .................................................. H05K 1/0245
USPC ...................... 333/1, 4, 5, 238, 246
See application file for complete search history.

(56) References Cited

U.S. PATENT DOCUMENTS

| 3,761,842 | A | * | 9/1973 | Gandrud | 333/1 |
|---|---|---|---|---|---|
| 5,389,735 | A | | 2/1995 | Bockelman | |
| 5,471,010 | A | | 11/1995 | Bockelman et al. | |
| 5,939,952 | A | * | 8/1999 | Noda et al. | 333/1 |
| 6,410,845 | B2 | | 6/2002 | Reede | |
| 7,142,501 | B1 | | 11/2006 | Barrass et al. | |
| 7,271,985 | B1 | * | 9/2007 | Buhler et al. | 360/245.9 |
| 2003/0222727 | A1 | * | 12/2003 | McCurdy et al. | 333/1 |
| 2005/0053227 | A1 | | 3/2005 | Fortier | |
| 2010/0200276 | A1 | * | 8/2010 | Karikalan | 174/250 |

FOREIGN PATENT DOCUMENTS

CN 1126117 C 10/2003

OTHER PUBLICATIONS

"Optimally-Placed Twists in Global On-Chip Differential Interconnects," Proc. of ESSCIRC, Grenoble, France, 2005, pp. 475-478 (Mensink, et al.).
PCT Search Report mailed Nov. 28, 2012.

* cited by examiner

*Primary Examiner* — Benny Lee
(74) *Attorney, Agent, or Firm* — Gregory J. Albin; Frank D. Cimino

(57) ABSTRACT

An apparatus is provided. The apparatus generally comprises a plurality of pairs of differential transmission lines. The plurality of pairs of differential transmission lines includes a set of pairs of differential transmission lines with each pair of differential transmission lines from the set of pairs of differential transmission lines including at least one twist to alternate current direction. Also, the plurality of differential transmission lines are arranged such that alternating current directions substantially eliminate cross-talk across the plurality of pairs of differential transmission lines.

12 Claims, 8 Drawing Sheets

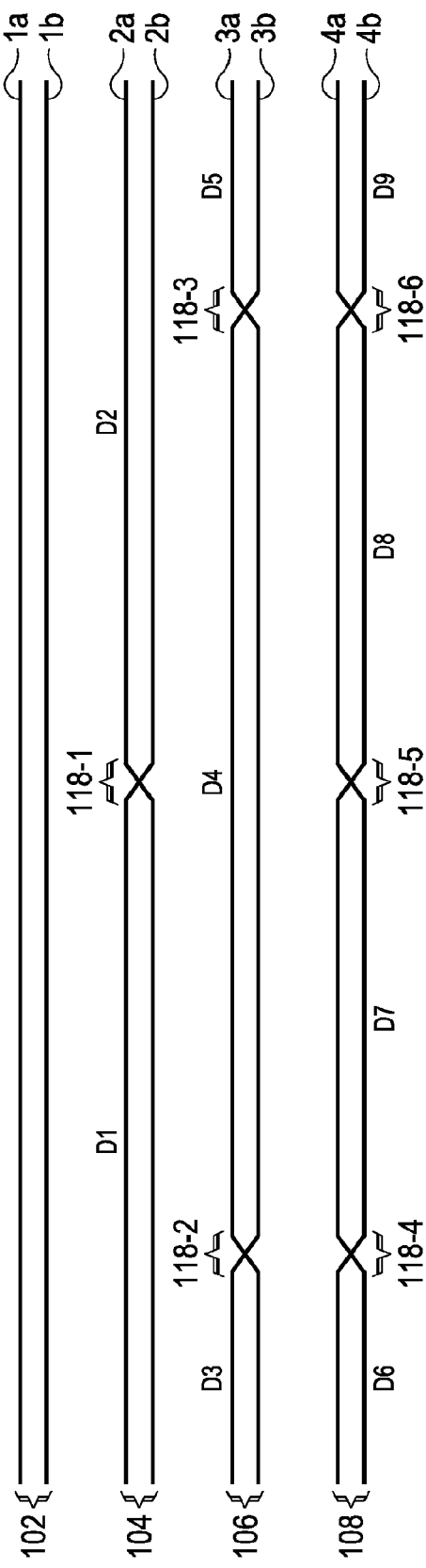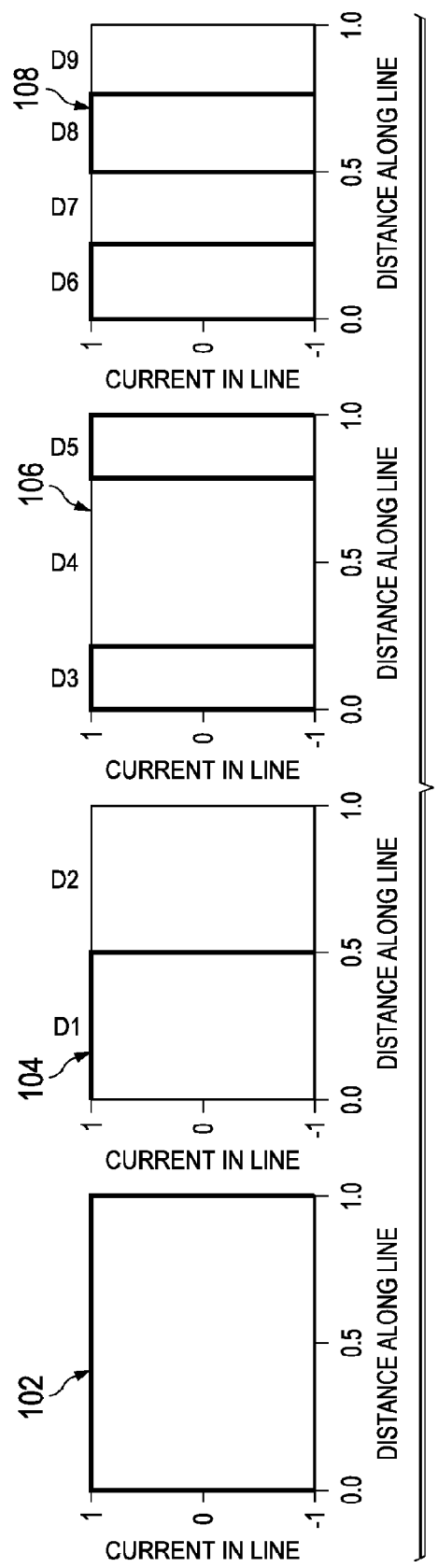
FIG. 3A
FIG. 3B

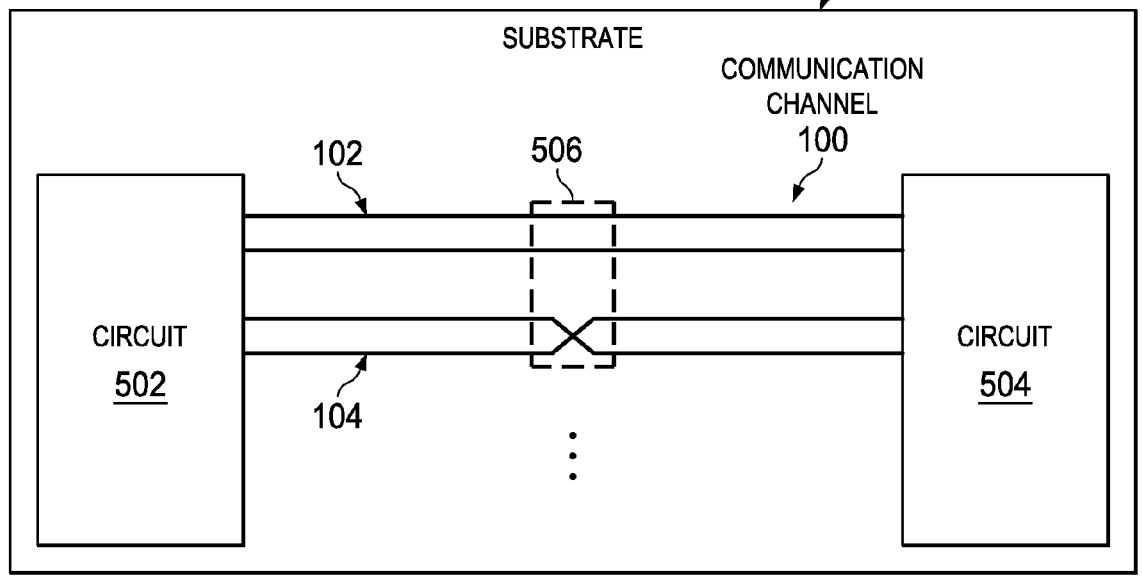
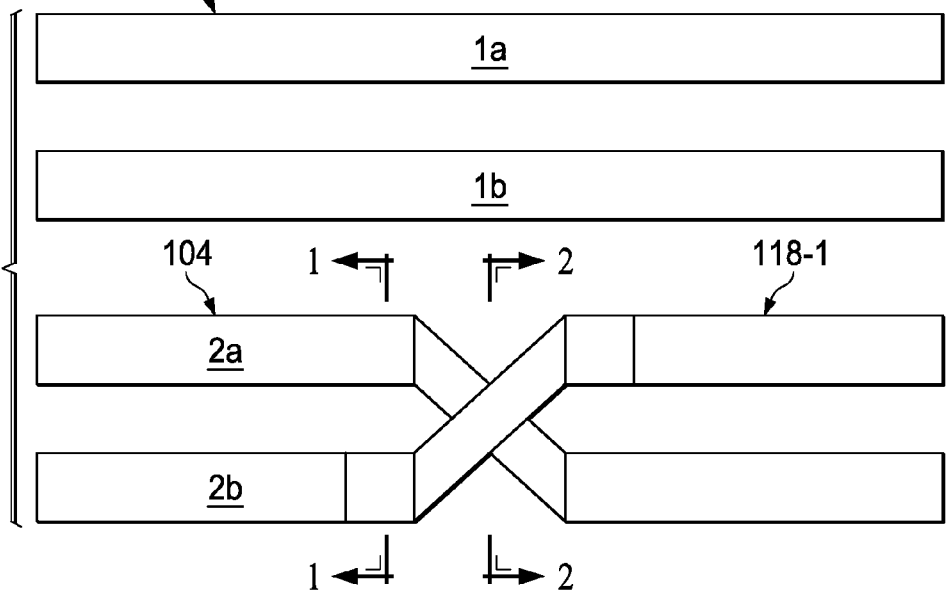

US 9,240,619 B2

DIFFERENTIAL TRANSMISSION LINE PAIRS USING A COUPLING ORTHOGONALIZATION APPROACH TO REDUCE CROSS-TALK

TECHNICAL FIELD

The invention relates generally to communication over differential lines and, more particularly, to reducing cross-talk over differential lines.

BACKGROUND

As on-chip density increases, as distances shrink, and as speeds increase, cross-talk between communication lines has become an ever-increasing problem. Cross-talk, however, is a well-known problem that has been examined for many years, creating several solutions. Examples of these solutions are the use of shielding, microstrips, and multi-mode transmission line theory, but each solution has drawbacks, which means that each is ill-suited for use in high-density on-chip communication lines. Therefore, there is a need for a way to reduce cross-talk.

An example of a conventional arrangement is Mensink et al., "Optimally-Placed Twists in Global On-Chip Differential Interconnects," *Proc. of ESSCIRC*, Grenoble, France, 2005, pp. 475-478

SUMMARY

A preferred embodiment of the present invention, accordingly, provides an apparatus comprising a plurality of pairs of differential transmission lines, wherein the plurality of pairs of differential transmission lines includes a set of pairs of differential transmission lines with each pair of differential transmission lines from the set of pairs of differential transmission lines including at least one twist to alternate current direction, and wherein the plurality of differential transmission lines are arranged such that alternating current directions substantially eliminate cross-talk across the plurality of pairs of differential transmission lines.

In accordance with a preferred embodiment of the present invention, the plurality of pairs of differential transmission lines are substantially parallel to one another, and wherein pair of differential transmission lines is separated from each adjacent pair of differential transmission lines by a first distance, and wherein differential transmission lines in each pair of differential transmission lines are separated from one another by a second distance, and wherein the first distance is greater than the second distance.

In accordance with a preferred embodiment of the present invention, each pair of differential transmission lines includes a positive line and a negative line, and wherein the cross-coupling between $i^{th}$ and $j^{th}$ differential pair is a linear combination of cross-couplings of the positive and negative lines of each of the $i^{th}$ and $j^{th}$ differential pair with one another, wherein the cross-couplings of the positive and negative lines of each of the $i^{th}$ and $j^{th}$ differential pair with one another are each a function of a total distance between the $i^{th}$ and $j^{th}$ differential pair and currents traversing the $i^{th}$ and $j^{th}$ differential pair, and wherein the twists from the set of pairs of differential transmission lines substantially orthogonalize cross-couplings between each pair of differential transmission lines.

In accordance with a preferred embodiment of the present invention, the linear combination of cross-couplings of the positive and negative lines of each of the $i^{th}$ and $j^{th}$ differential pair with one another is:

$$\phi_{i,j} = \phi_{ia,ja} - \phi_{ia,jb} - \phi_{ib,ja} + \phi_{ib,jb},$$

where $\phi_{ia,ja}$ is the cross-coupling between the positive lines of the $i^{th}$ and $j^{th}$ differential pair, $\phi_{ia,jb}$ is the cross-coupling between the positive line of the $i^{th}$ differential pair and the negative line of the $j^{th}$ differential pair, $\phi_{ib,ja}$ is the cross-coupling between the negative line of the $i^{th}$ differential pair and the positive line of the $j^{th}$ differential pair, $\phi_{ib,jb}$ is the cross-coupling between the negative lines of the $i^{th}$ and $j^{th}$ differential pair, and wherein $\phi_{ia,ja}$, $\phi_{ia,jb}$, $\phi_{ib,ja}$, and $\phi_{ib,jb}$ are:

$$\phi_{i[n],j[m]} \propto \frac{1}{l_{j[m]} l_{i[n]}} \int_{l_{j[m]}} \int_{l_{i[n]}} \frac{i_{i[n]}(l_{i[n]}) i_{j[m]}(l_{j[m]})}{r_{i[n],j[m]}} dl_{j[m]} dl_{i[n]},$$

where $n,m \in \{a,b\}$, $r_{i[n],j[m]}$ is the distance between transmission lines $i[n]$ and $j[m]$, $l_{i[n]}$ is the length of transmission line $i[n]$, $l_{j[m]}$ is the length of transmission line $j[m]$, $i_{i[n]}(l_{i[n]})$ is the current through transmission line $i[n]$ over length $l_{i[n]}$, and $i_{j[m]}(l_{j[m]})$ is the current through transmission line $j[m]$ over length $l_{j[m]}$.

In accordance with a preferred embodiment of the present invention, the apparatus further comprises: a first pair of differential transmission lines from the plurality of pairs of differential transmission lines that does not include any twists and that has a first length; and a second pair of differential transmission lines from the set of pairs of differential transmission lines that has a second length and that is adjacent to the first pair of differential transmission lines, wherein the second length is approximately equal to the first length, and wherein the second pair of differential transmission lines includes a twist at a point about that is at about one-half of the second length.

In accordance with a preferred embodiment of the present invention, the apparatus further comprises an integrated circuit (IC) having: a first circuit formed on a substrate; a second circuit formed on the substrate; and a communication channel formed on the substrate, wherein the communication channel includes the plurality of pairs of differential transmission lines that allow the first and second circuits to communicate with one another.

In accordance with a preferred embodiment of the present invention, the apparatus further comprises: a printed circuit board (PCB); a first IC that is secured to the PCB; a second IC that is secured to the PCB; and a communication channel formed on the PCB, wherein the communication channel includes the plurality of pairs of differential transmission lines that allow the first and second ICs to communicate with one another.

In accordance with a preferred embodiment of the present invention, an apparatus is provided. The apparatus comprises a first pair of differential transmission lines, wherein the differential transmission lines from the first pair are separated from one another by a first distance, and each differential transmission line from the first pair has a length; a second pair of differential transmission lines, wherein the differential transmission lines from the second pair are separated from one another by the first distance, and wherein each differential transmission line from the second pair has the length, and wherein the second pair is substantially parallel and adjacent to the first pair, and wherein the first pair is separated from the second pair by a second distance, and wherein the second distance is greater than the first distance; and a third pair of differential transmission lines, wherein the differential transmission lines from the third pair are separated from one another by the first distance, and wherein each differential transmission line from the third pair has the length, and wherein the third pair is substantially parallel and adjacent to the second pair, and wherein the third pair is separated from the second pair by the second distance, and wherein cross-coupling between the first, second, and third pairs is a function of currents traversing the first, second, and third pairs, and wherein the first, second, and third pairs of differential transmission lines are arranged such that the currents traversing the first, second, and third pairs of differential transmission lines substantially orthogonalize cross-couplings between each of the first, second, and third pairs.

In accordance with a preferred embodiment of the present invention, each of the second and third pairs include at least one twist to alternate current direction.

In accordance with a preferred embodiment of the present invention, each of the first, second, and third pairs includes a positive line and a negative line, and wherein the cross-coupling between $i^{th}$ and $j^{th}$ differential pair is a linear combination of cross-couplings of the positive and negative lines of each of the $i^{th}$ and $j^{th}$ differential pair with one another, wherein the cross-couplings of the positive and negative lines of each of the $i^{th}$ and $j^{th}$ differential pair with one another are each a function of a total distance between the $i^{th}$ and $j^{th}$ differential pair and currents traversing the $i^{th}$ and $j^{th}$ differential pair, and wherein the twists from the second and third pairs substantially orthogonalize cross-couplings between each pair of differential transmission lines.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A depicts a third example of communication channels using a coupling orthogonalization approach in accordance with a preferred embodiment of the present invention;

FIG. 3B depicts graphs of behavior of FIG. 3A;

FIG. 5 is an example of an integrated circuit (IC) that uses the type of communication depicted in FIGS. 1A, 1B, 2A, 2B, 3A, 3B, 4A and 4B;

FIG. 6A is an area of the communication for FIG. 5 depicting a twist in a pair;

DETAILED DESCRIPTION

Figure 1A:
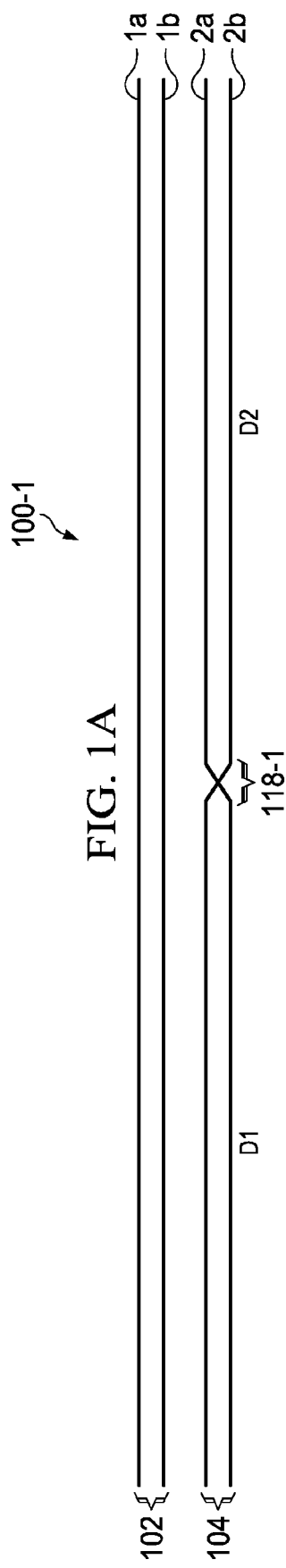
FIG. 1A depicts a first example of communication channels using a coupling orthogonalization approach in accordance with a preferred embodiment of the present invention.

Refer now to the drawings wherein depicted elements are, for the sake of clarity, not necessarily shown to scale and wherein like or similar elements are designated by the same reference numeral through the several views.

Differential signaling generally employs pairs of conductors that each carry a portion of a differential signal (i.e., positive and negative portions), and, as is well-know, electromagnetic fields are generate in the volume surrounding conductors when a signal is traversing the conductor. When signals traverse differential pairs, though, there generally is no intra-pair coupling or cross-talk because the currents in the pair of conductors have the same magnitude, but different directions. This means that the electromagnetic fields cancel each other and that conductor pairs can be closely spaced (i.e., very near to one another or have a narrow pitch). There can, however, be intra-pair coupling between adjacent or near-by pairs of conductors. Typically, the coupling or cross-talk between these adjacent or near-by pairs of conductors is a function of the distance and the currents traversing the conductors.

In FIG. 1A, pairs 102 and 104 can be seen. Each of these pair 102 and 104 includes conductors that carry a positive portion of a differential signal (i.e., 1a and 2a, respectively) and a conductor that carries a negative portion of a differential signal (i.e., 1b and 2b, respectively). In this example, the pitch or distance between the intra-pair conductors or transmission lines (i.e., between 1a and 1b) is less than the pitch or distance between pairs 102 and 104. The coupling or cross-talk for this communication channel 100-1 would also be a linear combination of the couplings between each of the conductors, which is as follows:

$$\phi_{1,2} = \phi_{1a,1b} + \phi_{2a,2b} + \phi_{1a,2a} - \phi_{1a,2b} - \phi_{1b,2a} + \phi_{1b,2b} \quad (1)$$
$$= +\phi_{1a,2a} - \phi_{1a,2b} - \phi_{1b,2a} + \phi_{1b,2b}$$

The coupling ($\Phi$) is a function of the total distance between the conductors and currents traversing the conductors, substantially having the following form:

$$\phi_{i[n],j[m]} \propto \frac{1}{l_{j[m]}l_{i[n]}} \int_{l_{j[m]}} \int_{l_{i[n]}} \frac{i_{i[n]}(l_{i[n]})i_{j[m]}(l_{j[m]})}{r_{i[n],j[m]}} dl_{j[m]} dl_{i[n]} \quad (2)$$

where $n,m \in \{a,b\}$, $r_{i[n],j[m]}$ is the distance between conductors or transmission lines $i[n]$ and $j[m]$, $l_{i[n]}$ is the length of transmission line $i[n]$, $l_{j[m]}$ is the length of transmission line $j[m]$, $i_{i[n]}(l_{i[n]})$ is the current through transmission line $i[n]$ over length $l_{i[n]}$, and $i_{j[m]}(l_{j[m]})$ is the current through transmission line $j[m]$ over length $l_{j[m]}$. For the communication channel 100-1, the couplings or cross-talk would be:

$$\phi_{1a,2a} \propto \frac{1}{l_{1a}l_{2a}} \int_{l_{1a}} \int_{l_{2a}} \frac{i_{1a}(l_{1a})i_{2a}(l_{2a})}{r_{1a,2a}} dl_{1a} dl_{2a} \quad (3)$$

$$\phi_{1a,2b} \propto \frac{1}{l_{1a}l_{2b}} \int_{l_{1a}} \int_{l_{2b}} \frac{i_{1a}(l_{1a})i_{2b}(l_{2ba})}{r_{1a,2b}} dl_{1a} dl_{2b} \quad (4)$$

$$\phi_{1b,2a} \propto \frac{1}{l_{1b}l_{2a}} \int_{l_{1b}} \int_{l_{2a}} \frac{i_{1b}(l_{1b})i_{2a}(l_{2a})}{r_{1b,2a}} dl_{1b} dl_{2a} \quad (5)$$

$$\phi_{1b,2b} \propto \frac{1}{l_{1b}l_{2b}} \int_{l_{1b}} \int_{l_{2b}} \frac{i_{1a}(l_{1a})i_{2b}(l_{2b})}{r_{1b,2b}} dl_{1b} dl_{2b} \quad (6)$$

Understanding that the field for intra-pair conductors (i.e., 1a and 1b) is cancelled because the current directions are opposite one another, this condition can be thought of as orthogonality. This "orthogonality" can be extended to inter-pair fields by introducing twists (i.e., 118-1) to swap the current direction. These twists within the differential pairs (i.e., 102 and 104) can be spaced along the differential pairs (i.e., 104) in patterns such that the coupling between each pair is substantially zero.

Figure 1B:
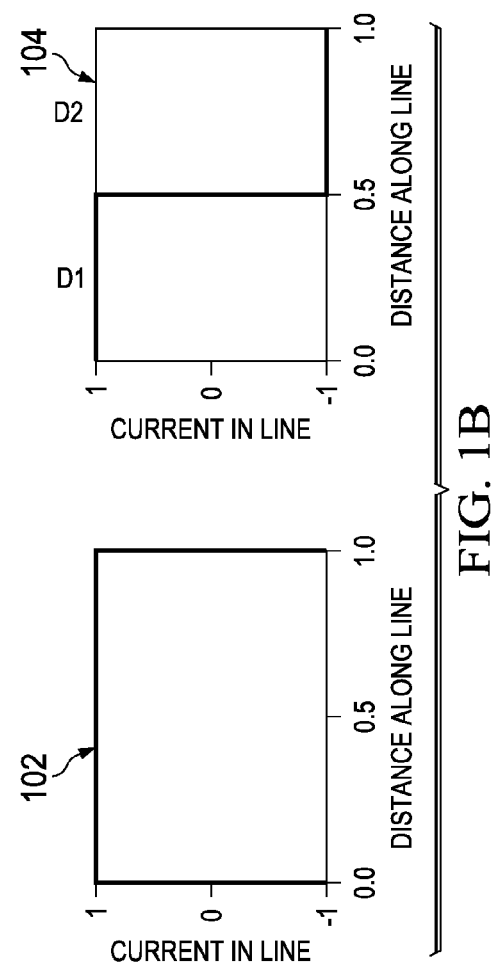
FIG. 1B depicts graphs of behavior of FIG. 1A.

Looking first to FIGS. 1A and 1B, orthogonality between pairs 102 and 104 can be seen. For pair 102, there are no twists, and, as shown, the collective current in the line pair 102 can be expressed as "+1." If a twist 118-1 is introduced to pair 104 at point halfway along the distance or length of the line pair 102 (which has a length that is approximately the same as pair 102 and where distance D1 is approximately equal to distance D2), the current for pair 104 can be expressed as "+1" along distance D1 and "−1" along distance D2. This would mean that equations (2) to (5) above would become:

$$\phi_{1a,2a} \propto \frac{1}{l_{1a}l_{2a}} \left[ \int_0^{\frac{l_{2a}}{2}} \int_{l_{1a}} \frac{i_{1a}(l_{1a})i_{2a}(l_{2a})}{r_{1a,2a}} dl_{1a} dl_{2a} - \int_{\frac{l_{2a}}{2}}^{l_{2a}} \int_{l_{1a}} \frac{i_{1a}(l_{1a})i_{2a}(l_{2a})}{r_{1a,2a}} dl_{1a} dl_{2a} \right] \quad (7)$$

$$\phi_{1a,2b} \propto \frac{1}{l_{1a}l_{2b}} \left[ \int_0^{\frac{l_{2b}}{2}} \int_{l_{1a}} \frac{i_{1a}(l_{1a})i_{2b}(l_{2b})}{r_{1a,2b}} dl_{1a} dl_{2b} - \int_{\frac{l_{2b}}{2}}^{l_{2b}} \int_{l_{1a}} \frac{i_{1a}(l_{1a})i_{2b}(l_{2b})}{r_{1a,2b}} dl_{1a} dl_{2b} \right] \quad (8)$$

$$\phi_{1b,2a} \propto \frac{1}{l_{1b}l_{2a}} \left[ \int_0^{\frac{l_{2a}}{2}} \int_{l_{1b}} \frac{i_{1b}(l_{1b})i_{2a}(l_{2a})}{r_{1b,2a}} dl_{1b} dl_{2a} - \int_{\frac{l_{2a}}{2}}^{l_{2a}} \int_{l_{1b}} \frac{i_{1b}(l_{1b})i_{2a}(l_{2a})}{r_{1b,2a}} dl_{1b} dl_{2a} \right] \quad (9)$$

$$\phi_{1b,2b} \propto \frac{1}{l_{1b}l_{2b}} \left[ \int_0^{\frac{l_{2b}}{2}} \int_{l_{1b}} \frac{i_{1b}(l_{1b})i_{2b}(l_{2b})}{r_{1b,2b}} dl_{1b} dl_{2b} - \int_{\frac{l_{2b}}{2}}^{l_{2b}} \int_{l_{1b}} \frac{i_{1b}(l_{1b})i_{2b}(l_{2b})}{r_{1b,2b}} dl_{1b} dl_{2b} \right] \quad (10)$$

Substituting equations (7) through (10) into equation (1), the coupling between pairs 102 and 104 would be:

$$\phi_{1,2} = +\phi_{1a,2a} - \phi_{1a,2b} - \phi_{1b,2a} + \phi_{1b,2b} \quad (11)$$

$$= \frac{1}{l_{1a}l_{2a}} \int_0^{\frac{l_{2a}}{2}} \int_{l_{1a}} \frac{i_{1a}(l_{1a})i_{2a}(l_{2a})}{r_{1a,2a}} dl_{1a} dl_{2a} -$$

$$\frac{1}{l_{1a}l_{2a}} \int_{\frac{l_{2a}}{2}}^{l_{2a}} \int_{l_{1a}} \frac{i_{1a}(l_{1a})i_{2a}(l_{2a})}{r_{1a,2a}} dl_{1a} dl_{2a} -$$

$$\frac{1}{l_{1a}l_{2b}} \int_0^{\frac{l_{2b}}{2}} \int_{l_{1a}} \frac{i_{1a}(l_{1a})i_{2b}(l_{2b})}{r_{1a,2b}} dl_{1a} dl_{2b} +$$

$$\frac{1}{l_{1a}l_{2b}} \int_{\frac{l_{2b}}{2}}^{l_{2b}} \int_{l_{1a}} \frac{i_{1a}(l_{1a})i_{2b}(l_{2b})}{r_{1a,2b}} dl_{1a} dl_{2b} -$$

$$\frac{1}{l_{1b}l_{2a}} \int_0^{\frac{l_{2a}}{2}} \int_{l_{1b}} \frac{i_{1b}(l_{1b})i_{2a}(l_{2a})}{r_{1b,2a}} dl_{1b} dl_{2a} +$$

$$\frac{1}{l_{1b}l_{2a}} \int_{\frac{l_{2a}}{2}}^{l_{2a}} \int_{l_{1b}} \frac{i_{1b}(l_{1b})i_{2a}(l_{2a})}{r_{1b,2a}} dl_{1b} dl_{2a} +$$

$$\frac{1}{l_{1b}l_{2b}} \int_0^{\frac{l_{2b}}{2}} \int_{l_{1b}} \frac{i_{1b}(l_{1b})i_{2b}(l_{2b})}{r_{1b,2b}} dl_{1b} dl_{2b} -$$

$$\frac{1}{l_{1b}l_{2b}} \int_{\frac{l_{2b}}{2}}^{l_{2b}} \int_{l_{1b}} \frac{i_{1b}(l_{1b})i_{2b}(l_{2b})}{r_{1b,2b}} dl_{1b} dl_{2b}$$

For reasonably short lines (i.e., less than 1/10 of a wavelength), twist 118-1 (positioned halfway along the length of pair 104) will result in the coupling between pairs 102 and 104 (i.e., equation 11) to be zero.

Figure 2A:
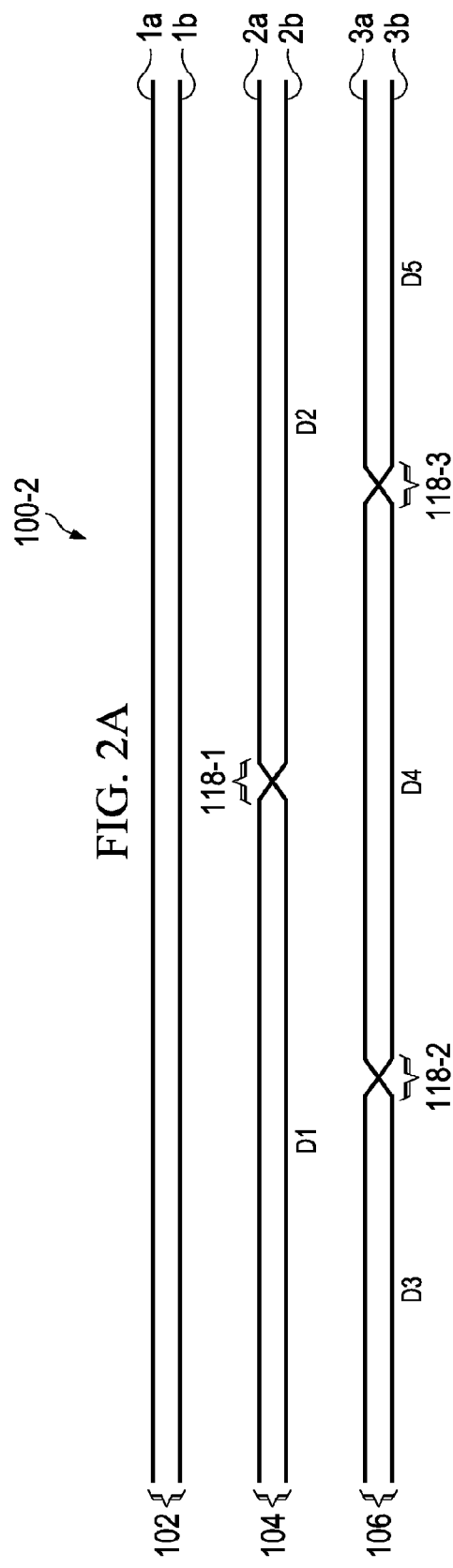
FIG. 2A depicts a second example of communication channels using a coupling orthogonalization approach in accordance with a preferred embodiment of the present invention.
Figure 2B:
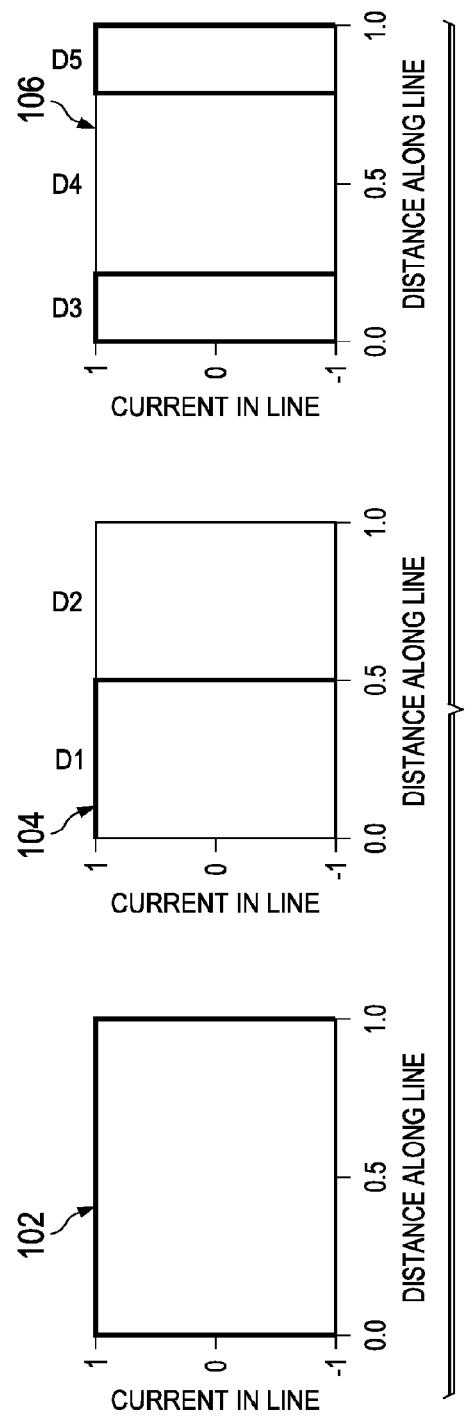
FIG. 2B depicts graphs of behavior of FIG. 2A.
Figure 4A:
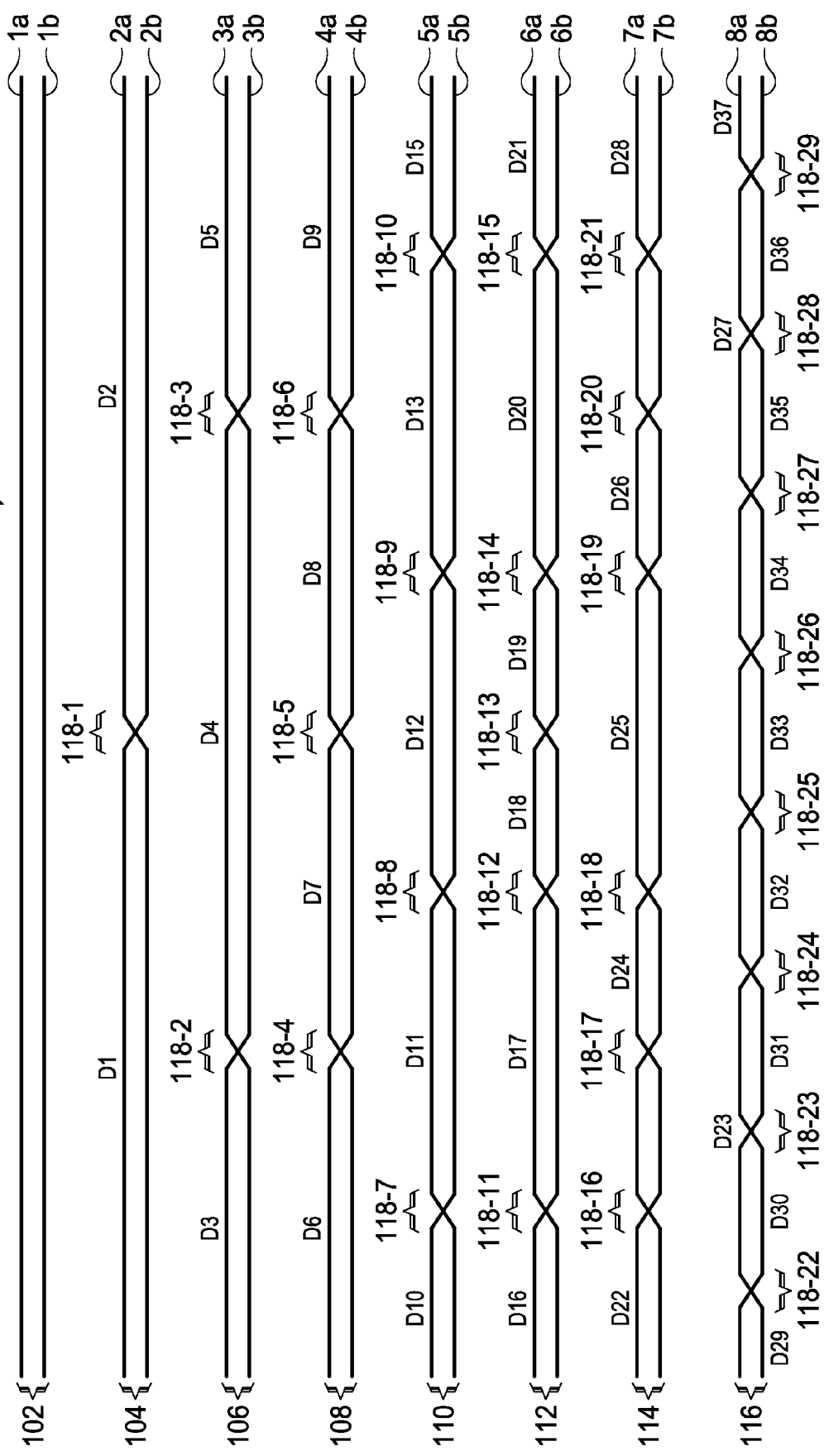
FIG. 4A depicts a third example of communication channels using a coupling orthogonalization approach in accordance with a preferred embodiment of the present invention.
Figure 4B:
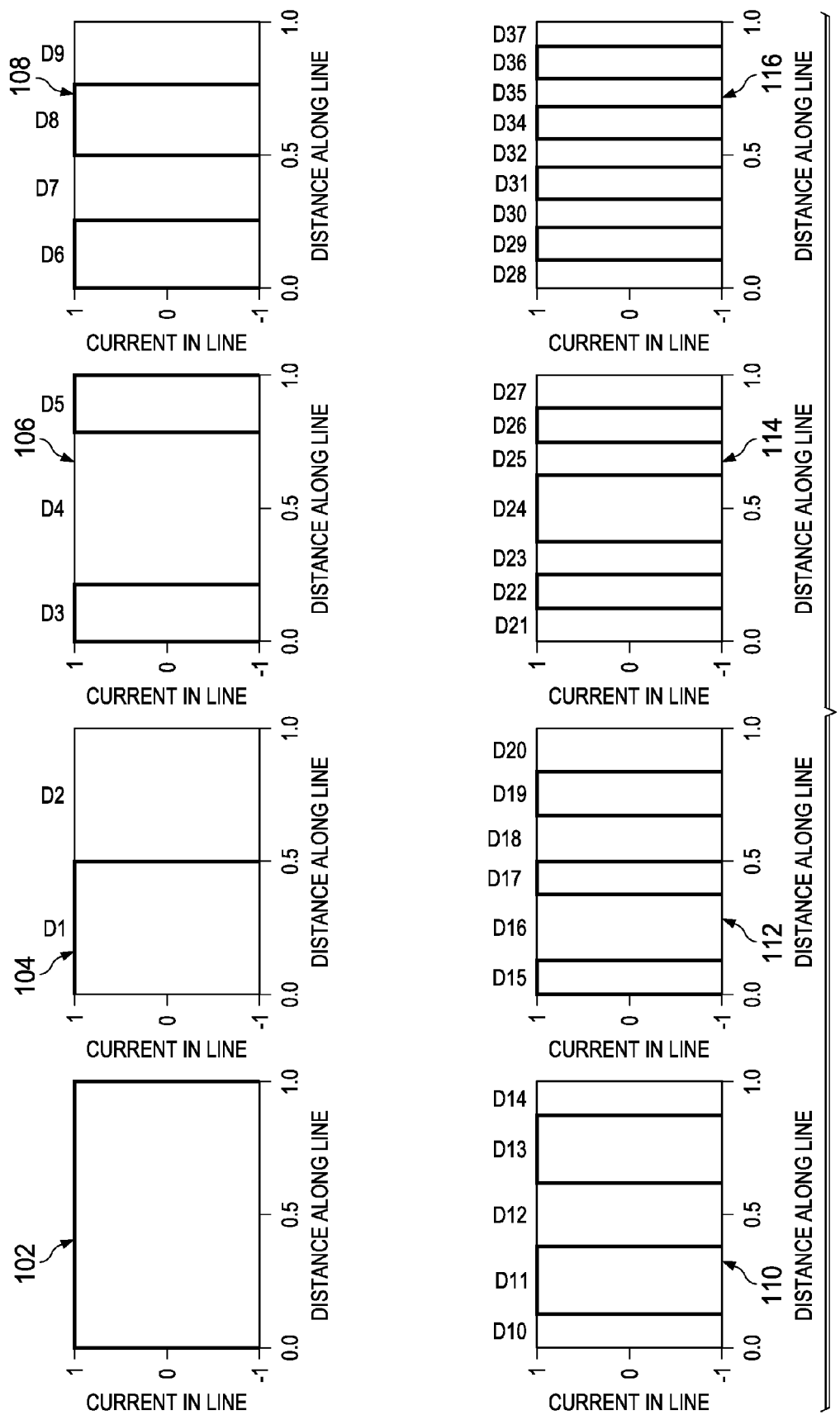
FIG. 4B depicts graphs of behavior of FIG. 4A.

Turning to FIGS. 2A and 2B, orthogonality between three pairs 102, 104, and 106 of conductors 1a, 1b, 2a, 2b, 3a, 3b in communication channel 100-2 can be seen. In this example, pair 106 includes twists 118-2 and 118-3 so that the current for pair 106 can be represents as "+1" along distance D3, "−1" along distance D4, and "+1" along distance D5. As shown, these current directions (representations) are a function of distance along the length of the pairs (i.e., 102 and 104), which has the effect of creating a binary looking current distribution versus distance. Thus, by adjusting distances D1 through D5, orthogonality between pairs 102, 104, and 106, meaning that the inter-pair couplings between the pairs 102, 104, and 106 are approximately zero.

In FIGS. 3A to 4B, examples of communication channels 100-3 and 100-4 (which have 4 and 8 pairs, respectively) can be seen. Similar to communication channels 100-1 and 100-2, pairs 108, 110, 112, 114, and 116 of conductors 4a, 4b, 5a, 5b, 6a, 6b, 7a, 7b, 8a, 8b have twists 118-4 through 118-29 spaced along distances D6 through D13 and D15 through D37. These distances, too, can be adjusted to achieve inter-pair couplings between the pairs 108, 110, 112, 114, and 116 are approximately zero, which demonstrates that this orthogonalization scheme can be extended to any number of pairs of differential lines.

Turning now to FIG. 5, an integrated circuit (IC) 500 that employs a communication channel like 100-1 to 100-4 (referred to hereinafter as 100). For this IC 500, there are (for example) two circuits 502 and 504, which are formed on substrate 508, with the communication channel 100 formed therebetween. The communication channel 100 can include any number of pairs of differential lines or conductors, but for the sake of simplicity two are shown (102 and 104).

Figure 6B:
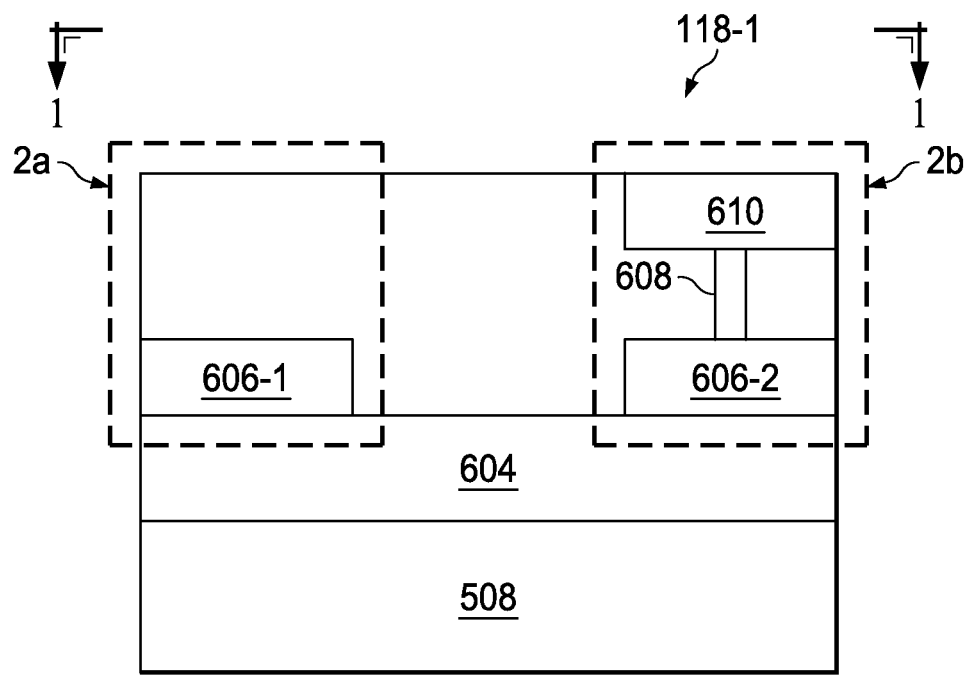
FIG. 6B is a cross-sectional view of the pair along section line 1-1 of FIG. 6A.
Figure 6C:
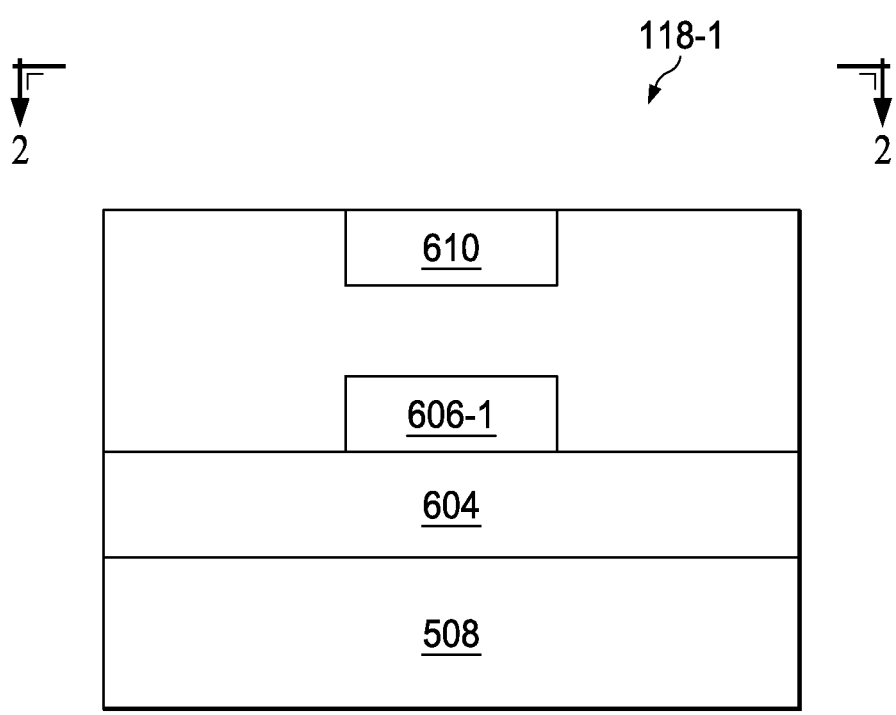
FIG. 6C is a cross-sectional view of the pair along section line 2-2; of FIG. 6A

Looking to area 506, pairs 102 and 104 can be seen in greater detail in FIG. 6A through 6C. Specifically, twist 118-1 be seen. Typically, each of the conductors (i.e., 1a) is formed of a conductive strip of metal (which is a portion of a metallization layer). Here, the conductors 2a and 2b in FIGS. 6B and 6C are formed by metallization layer 606 (which can, for example, be aluminum or copper), being portions 606-1 and 606-2, which is formed over layer 604 (which may comprise several layers). For the twist 118-1, vias (i.e., 608), which may be formed of tungsten, couple a metallization layer to metallization layer 610 (which may also be formed of copper or aluminum). To support and isolate metallization layer 610 and via 608, dielectric material 112 (i.e., silicon dioxide) can use used in one or more layers.

Figure 7:
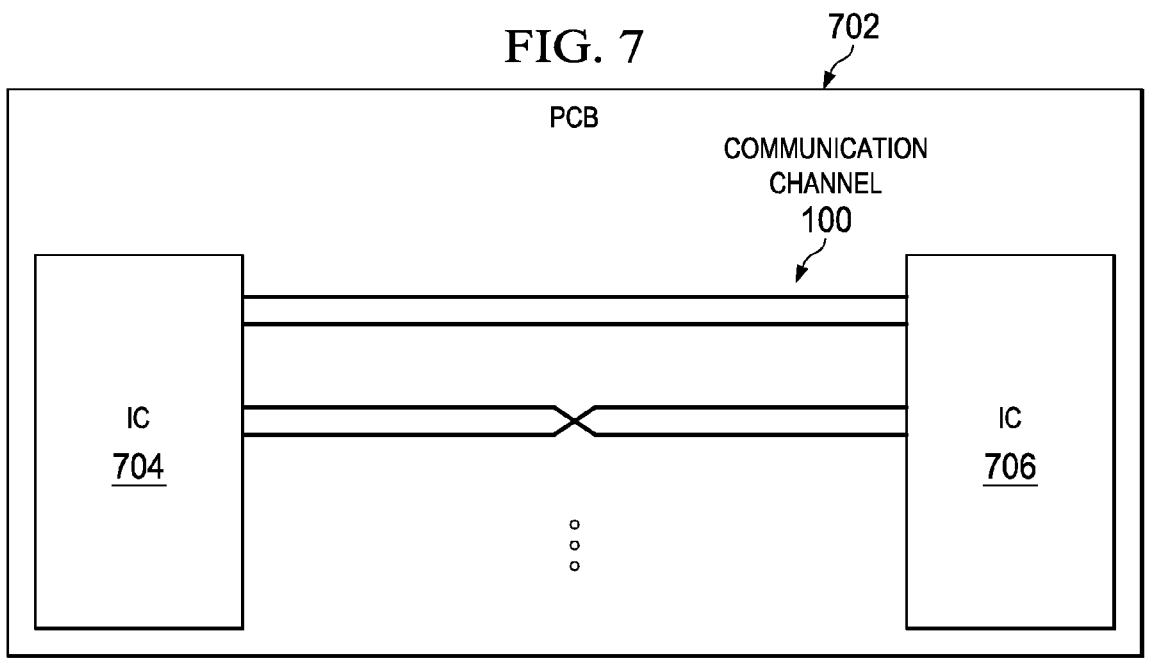
FIG. 7 is an example of a printed circuit board (PCB) that uses the type of communication channel depicted in FIGS. 1A, 1B, 2A, 2B, 3A, 3B, 4A and 4B.
Figure 8:
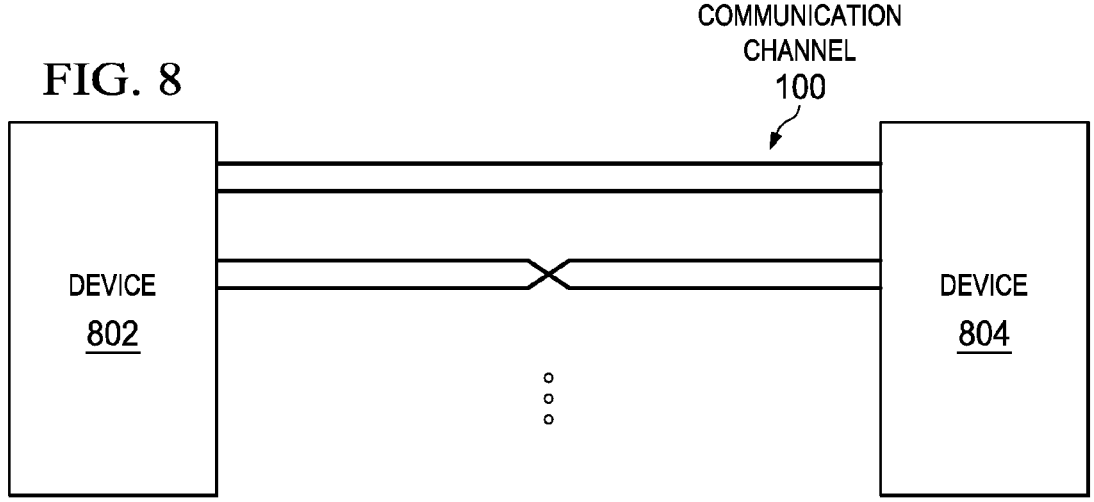
FIG. 8 is an example of system that uses the type of communication channel depicted in FIGS. 1A, 1B, 2A, 2B, 3A, 3B, 4A and 4B.

Finally, turning to FIGS. 7 and 8, other uses for the communication channel 100 can be seen. For example, in FIG. 7, communication channel 100 can be used for communication between ICs 704 and 706 (or between pins of one of the ICs 704 or 706) on a printed circuit board (PCB) 702. Alternatively, communication channel 100 (in the example of FIG. 8) can be used to communicate between devices 802 and 804.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention. Like features in different drawings are designated by the same reference labels.

The invention claimed is:

1. An apparatus comprising:
a plurality of pairs of differential transmission lines,
wherein the plurality of pairs of differential transmission lines includes a set of pairs of differential transmission lines with at least one pair of differential transmission lines from the set of pairs of differential transmission lines including at least one twist to alternate current direction, and
wherein the plurality of pairs of differential transmission lines are arranged such that alternating current directions substantially eliminate cross-talk across the plurality of pairs of differential transmission lines, wherein the plurality of pairs of differential transmission lines are substantially parallel to one another, and wherein each pair of differential transmission lines is separated from each adjacent pair of differential transmission lines by a first distance, and wherein differential transmission lines in each pair of differential transmission lines are separated from one another by a second distance, and wherein the first distance is greater than the second distance,
wherein each pair of differential transmission lines includes a positive line and a negative line, and wherein the cross-coupling between an $i^{th}$ and a $j^{th}$ differential pair is a linear combination of cross-couplings of the positive and negative lines of each of the $i^{th}$ and $j^{th}$ differential pair with one another, wherein the cross-couplings of the positive and negative lines of each of the $i^{th}$ and $j^{th}$ differential pair with one another are each a function of a total distance between the $i^{th}$ and $j^{th}$ differential pair and currents traversing the $i^{th}$ and $j^{th}$ differential pair,
and wherein the at least one twist substantially orthogonalizes cross-couplings between each pair of differential transmission lines.

2. The apparatus of claim 1, wherein the linear combination of cross-couplings of the positive and negative lines of each of the $i^{th}$ and $j^{th}$ differential pair with one another is:

$$\phi_{i,j} = \phi_{ia,ja} - \phi_{ia,jb} - \phi_{ib,ja} + \phi_{ib,jb},$$

$\phi_{ia,ja}$ is the cross-coupling between the positive lines of the ith and jth differential pair, $\phi_{ia,jb}$ is the cross-coupling between the positive line of the ith differential pair and the negative line of the jth differential pair, $\phi_{ib,ja}$ is the cross-coupling between the negative line of the ith differential pair and the positive line of the jth differential pair, $\phi_{ib,jb}$ is the cross-coupling between the negative lines of the ith and jth differential pair, and wherein $\phi_{ia,ja}$, $\phi_{ia,jb}$, $\phi_{ib,ja}$, and $\phi_{ib,jb}$ are:

$$\phi_{i[n],j[m]} \propto \frac{1}{l_{j[m]} l_{i[n]}} \int_{l_{j[m]}} \int_{l_{i[n]}} \frac{i_{i[n]}(l_{i[n]}) i_{j[m]}(l_{j[m]})}{r_{i[n],j[m]}} dl_{j[m]} dl_{i[n]},$$

where n, m∈{a,b}, $r_{i[n],j[m]}$ is the distance between the transmission lines i[n] and j[m], $l_{i[n]}$ is the length of the transmission line i[n], $l_{j[m]}$ is the length of the transmission line j[m], $i_{i[n]}(l_{i[n]})$ is the current through the transmission line i[n] over length $l_{i[n]}$, and $i_{j[m]}(l_{j[m]})$ is the current through the transmission line j[m] over length $l_{j[m]}$.

3. The apparatus of claim 2, wherein the apparatus further comprises:
a printed circuit board (PCB);
a first IC that is secured to the PCB;
a second IC that is secured to the PCB; and
a communication channel formed on the PCB, wherein the communication channel includes the plurality of pairs of differential transmission lines that allow the first and second ICs to communicate with one another.

4. The apparatus of claim 2, wherein the apparatus further comprises an integrated circuit (IC) having:
a first circuit formed on a substrate;
a second circuit formed on the substrate; and
a communication channel formed on the substrate, wherein the communication channel includes the plurality of pairs of differential transmission lines that allow the first and second circuits to communicate with one another.

5. The apparatus of claim 2, wherein the apparatus further comprises:
a first pair of differential transmission lines from the plurality of pairs of differential transmission lines that does not include any twists and that has a first length; and
a second pair of differential transmission lines from the set of pairs of differential transmission lines that has a second length and that is adjacent to the first pair of differential transmission lines, wherein the second length is approximately equal to the first length, and wherein the second pair of differential transmission lines includes a twist at a point that is at about one-half of the second length.

6. An apparatus comprising:
a first pair of differential transmission lines, wherein the differential transmission lines from the first pair are separated from one another by a first distance, and each differential transmission line from the first pair has a length;
a second pair of differential transmission lines, wherein the differential transmission lines from the second pair are separated from one another by the first distance, and wherein each differential transmission line from the second pair has the length, and wherein the second pair is substantially parallel and adjacent to the first pair, and wherein the first pair is separated from the second pair by a second distance, and wherein the second distance is greater than the first distance; and
a third pair of differential transmission lines, wherein the differential transmission lines from the third pair are separated from one another by the first distance, and wherein each differential transmission line from the third pair has the length, and wherein the third pair is substantially parallel and adjacent to the second pair, and wherein the third pair is separated from the second pair by the second distance, wherein cross-coupling between the first, second, and third pairs is a function of currents traversing the first, second, and third pairs, and wherein the first, second, and third pairs of differential transmission lines are arranged such that the currents traversing the first, second, and third pairs of differential transmission lines substantially orthogonalize cross-couplings between each of the first, second, and third pairs of the differential transmission lines.

7. The apparatus of claim 6, wherein each of the second and third pairs include at least one twist to alternate a current direction.

8. The apparatus of claim 7, wherein each of the first, second, and third pairs includes a positive line and a negative line, and wherein the cross-coupling between an $i^{th}$ and a $j^{th}$ differential pair is a linear combination of cross-couplings of the positive and negative lines of each of the $i^{th}$ and $j^{th}$ differential pair with one another, wherein the cross-couplings of the positive and negative lines of each of the $i^{th}$ and $j^{th}$ differential pair with one another are each a function of a total distance between the $i^{th}$ and $j^{th}$ differential pair and currents traversing the $i^{th}$ and $j^{th}$ differential pair, and wherein the at least one twist from each of the second and third pairs substantially orthogonalize cross-couplings between each pair of the first, second and third pairs of differential transmission lines.

9. The apparatus of claim 8, wherein the linear combination of cross-couplings of the positive and negative lines of each of the $i^{th}$ and $j^{th}$ differential pair with one another is:

$$\phi_{i,j} = \phi_{ia,ja} - \phi_{ia,jb} - \phi_{ib,ja} + \phi_{ib,jb},$$

where $\phi_{ia,ja}$ is the cross-coupling between the positive lines of the $i^{th}$ and $j^{th}$ differential pair, $\phi_{ia,jb}$ is the cross-coupling between the positive line of the $i^{th}$ differential pair and the negative line of the $j^{th}$ differential pair, $\phi_{ib,ja}$ is the cross-coupling between the negative line of the $i^{th}$ differential pair and the positive line of the $j^{th}$ differential pair, $\phi_{ib,jb}$ is the cross-coupling between the negative lines of the $i^{th}$ and $j^{th}$ differential pair, and wherein $\phi_{ia,ja}$, $\phi_{ia,jb}$, $\phi_{ib,ja}$, and $\phi_{ib,jb}$ are:

$$\phi_{i[n],j[m]} \propto \frac{1}{l_{j[m]} l_{i[n]}} \int_{l_{j[m]}} \int_{l_{i[n]}} \frac{i_{i[n]}(l_{i[n]}) i_{j[m]}(l_{j[m]})}{r_{i[n],j[m]}} dl_{j[m]} dl_{i[n]},$$

where n, m ∈ {a, b}, $r_{i[n],j[m]}$ is the distance between the transmission lines i[n] and j[m], $l_{i[n]}$ is the length of transmission line i[n], $l_{j[m]}$ is the length of the transmission line j[m], $i_{i[n]}(l_{i[n]})$ is the current through the transmission line i[n] over length $l_{i[n]}$, and $i_{j[m]}(l_{j[m]})$ is the current through the transmission line j[m] over length $l_{j[m]}$.

10. The apparatus of claim 9, wherein the apparatus further comprises an IC having:
a first circuit formed on a substrate;
a second circuit formed on the substrate; and
a communication channel formed on the substrate, wherein the communication channel includes the first, second, and third pairs of differential transmission lines that allow the first and second circuits to communicate with one another.

11. The apparatus of claim 10, wherein the apparatus further comprises:
a printed circuit board (PCB);
a first IC that is secured to the PCB;
a second IC that is secured to the PCB; and
a communication channel formed on the PCB, wherein the communication channel includes the first, second, and third pairs of differential transmission lines that allow the first and second ICs to communicate with one another.

12. The apparatus of claim 9, wherein the at least one twist of
the second pair includes a twist at a point that is at about one-half of the length of the second pair.

* * * * *